United States Patent [19]

Ott

[11] 4,364,707

[45] Dec. 21, 1982

[54] OBJECT TRANSPORT APPARATUS

[75] Inventor: James D. Ott, Mesa, Ariz.

[73] Assignee: Advanced Semiconductor Materials Die Bonding Inc., Chandler, Ariz.

[21] Appl. No.: 147,227

[22] Filed: May 6, 1980

[51] Int. Cl.³ .............................................. B25J 9/00
[52] U.S. Cl. ................................ 414/744 B; 414/786; 414/590; 414/737
[58] Field of Search ............... 414/744 R, 744 B, 590, 414/750, 752, 589, 4, 5, 737

[56] References Cited

U.S. PATENT DOCUMENTS

| | | | |
|---|---|---|---|
| 4,002,246 | 1/1977 | Brandt et al. | 414/744 B |
| 4,102,284 | 7/1978 | Rohr | 414/744 R |
| 4,146,924 | 3/1979 | Birk et al. | 414/5 X |
| 4,221,533 | 9/1980 | Heim et al. | 414/744 B |

*Primary Examiner*—Robert J. Spar
*Assistant Examiner*—Terrance L. Siemens
*Attorney, Agent, or Firm*—Harry M. Weiss

[57] ABSTRACT

This disclosure relates to an object transport apparatus particularly useful for the high speed handling of semiconductor chips. Transport is achieved by driving a vacuum pickup, through a rotational motion toward an object resting at a first reference location while simultaneously driving a cam, restraining a spring loaded cam follower, so that the vacuum pickup is positioned proximal to the first reference position. Vacuum is applied to secure the object to the pickup. The cam and shaft are then simultaneously driven in the opposite direction to clear the other objects and obstruction by swinging the object through an arcuate motion while simultaneously elevating the object. As the pickup and object continue through the arcuate motion, the cam motion is reversed to position the object proximal to a deposition surface located at a second reference position. The cam is then further driven to contact the object with the deposition surface, the vacuum is released and the object is released. The cam is then driven down to allow the pickup to avoid interference with the released object or other obstructions and both the cam drive and shaft drive return the pickup to an index position, readying the apparatus for another cycle. All motions and operations are controlled by a controller.

10 Claims, 5 Drawing Figures

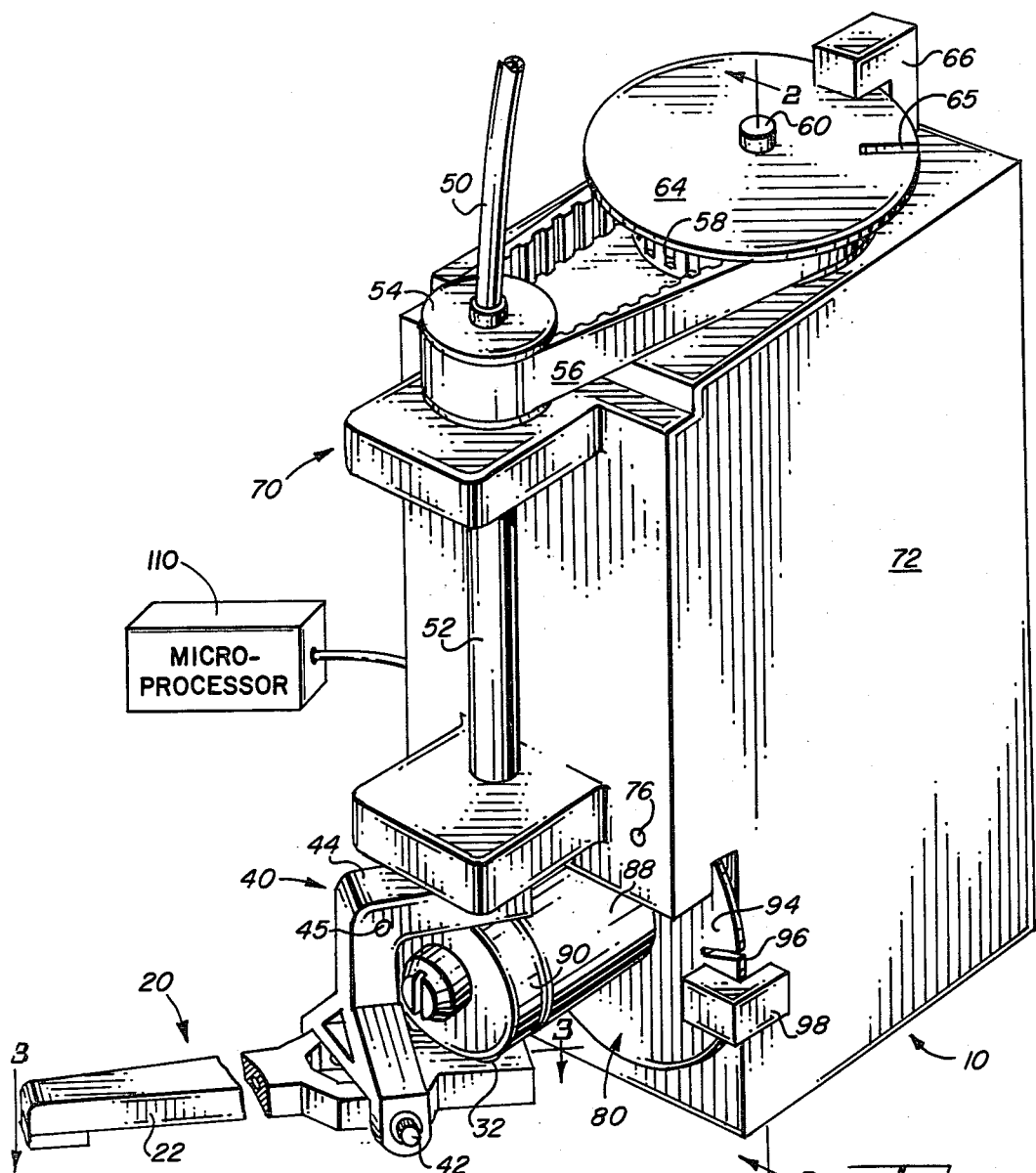
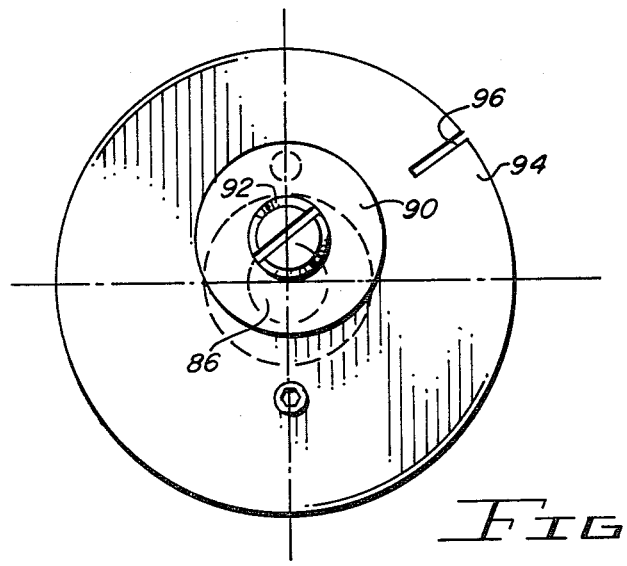

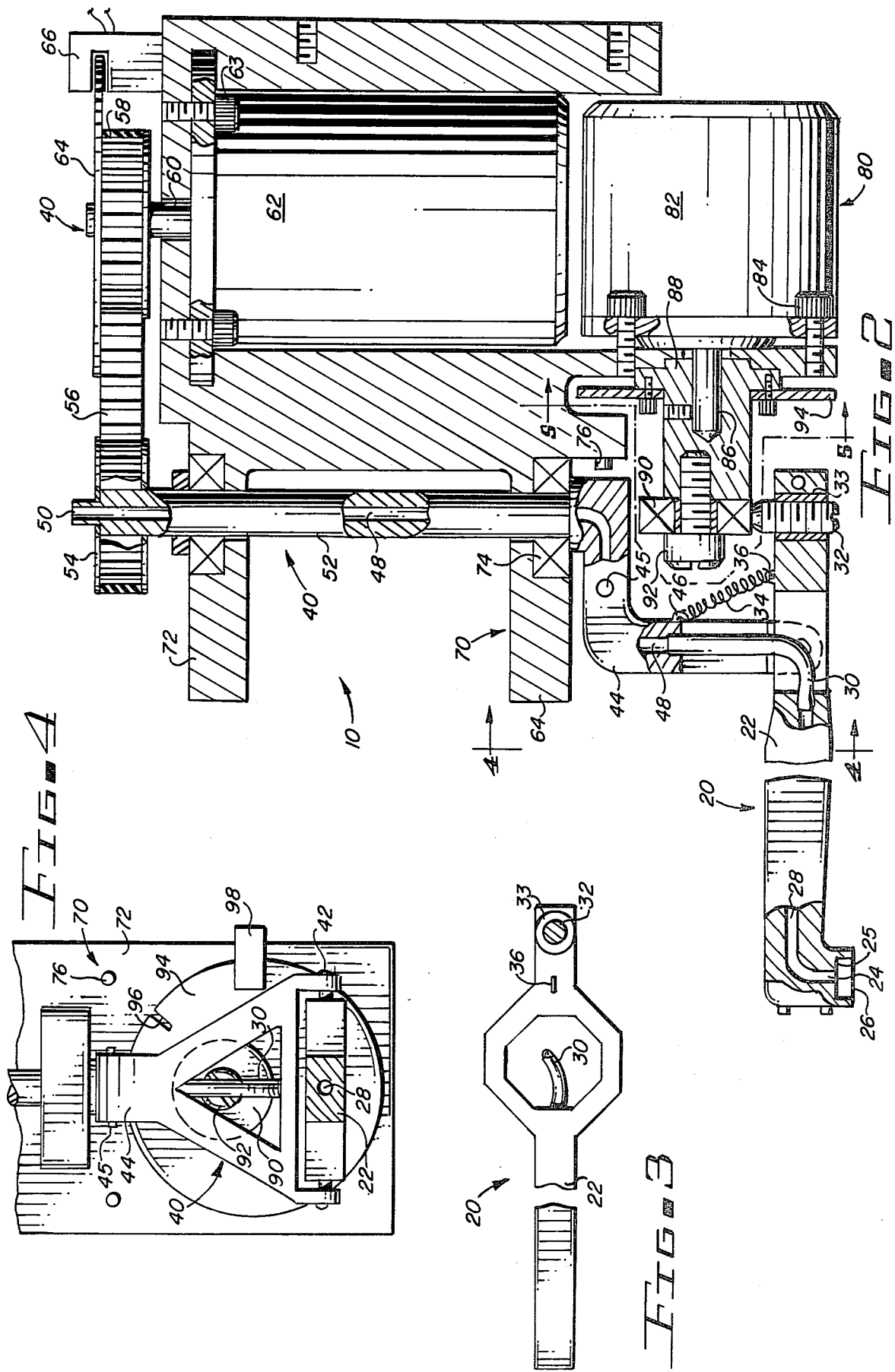

OBJECT TRANSPORT APPARATUS

BACKGROUND OF THE INVENTION

1. Field of the Invention

This invention relates generally to a transport mechanism and, more specifically, to a transport mechanism useful in the high speed manufacture of semiconductor devices.

2. Description of the Prior Art

In the past, semiconductor devices, as for example integrated circuits, have been assembled by various means. The manufacture of such devices requires a handling of the semiconductor chips cut from a wafer at the various stages of detachment from the wafer, inspection, and bonding to a lead frame.

Since the chips range in size from small to minute and are relatively mechanically fragile, a precise, delicate method of locating, picking and moving the semiconductor chips was necessary. Initially, this handling was done manually. Subsequently, various semi-automated and automated apparatus were developed to pick up a semiconductor chip. When removing a chip from the wafer matrix, either the pickup apparatus had to shift to select the next chip or the wafer support had to sequentially position each chip at a pickup point. The release of the chip occurred at a lateral distance from the pickup point at an elevation close to, but not necessarily the same as, the elevation of the pickup point. The actual releasable attachment was accomplished by adhering the chip to a pickup surface with a vacuum. The pickup apparatus was shifted to the respective chips of the wafer grid initially by an adjustable mechanical cam and linkage and, subsequently, by an X-Y transport mechanism driven by electric motors operable at the command of a control apparatus, as for example a computer. This motion was accomplished through the utilization of various mechanical linkages and unidirectionally rotating cams. These devices required substantial set-up time and proved relatively inflexible in that changes, including such minor changes as wafer thickness, required another set-up. Furthermore, such fixed mechanical linkage made no provision for a varying lift which would allow the transported chip to clear vertical obstructions of various heights.

A need existed to provide a semiconductor chip transport apparatus with the capability for rapid adjustment of the vertical and lateral positions of the respective pickup and deposit points.

The semi-automated and automated semiconductor chip transport apparatus in use moved the semiconductor chips through an X-Y-Z coordinate system of the motions thereby necessitating that the chip come to rest in an axial orientation in a horizontal plane such that it was essentially parallel to its pickup position.

A further need existed to provide a semiconductor chip transport apparatus which was capable of picking a semiconductor chip from a wafer and depositing it in a manner such that its X and Y horizontal axes were aligned in a controlled position other than parallel to their original orientation.

BRIEF DESCRIPTION OF THE DRAWINGS

FIG. 1 is a perspective view of a semiconductor chip transport apparatus embodying the disclosed invention.

FIG. 2 is an elevational sectional view of a semiconductor chip transport apparatus taken along line 2—2 of FIG. 1.

FIG. 3 is a top sectional view of a semiconductor chip transport apparatus taken along line 3—3 of FIG. 1.

FIG. 4 is an elevational sectional view of a semiconductor chip transport apparatus taken along line 4—4 of FIG. 2.

FIG. 5 is an elevational sectional view of a semiconductor chip transport apparatus taken along line 5—5 of FIG. 2.

SUMMARY OF THE INVENTION

In accordance with one embodiment of this invention, it is an object of this invention to provide an improved object transport apparatus.

It is another object of this invention to provide a semiconductor chip transport apparatus whose pickup and deposit reference points may be controlled by electrical inputs.

It is a further object of this invention to provide a semiconductor chip transport apparatus which swings a semiconductor chip through an arcuate motion while simultaneously providing a vertical motion of any magnitude within its vertical motion range at any point within that arcuate motion.

It is yet another object of this invention to provide a semiconductor chip transport apparatus which swings a semiconductor chip through an arcuate motion with controlled rates of acceleration and deceleration while simultaneously providing the chip with a vertical motion with controlled rates of acceleration and deceleration.

It is still another object of this invention to provide a semiconductor chip transport apparatus capable of picking a chip with a horizontal X and a horizontal Y reference axes and depositing the chip in a controlled position whereby the X and the Y axes are other than parallel to the original position.

DESCRIPTION OF THE PREFERRED EMBODIMENTS

In accordance with one embodiment of this invention, an object transport apparatus for conveying at least one object from a first reference surface position to a second reference surface position is disclosed, comprising pickup means having an upper and a lower vertical travel limit for releasably engaging the object; and transport means cooperatively connected to the pickup means for selecting any desired path of travel from the first reference position through an arcuate motion having an independently variable range of elevations equal to the vertical travel limits of the pickup means to the second reference position.

In accordance with another embodiment of this invention, a method for transporting an object is disclosed, comprising the step of swinging the object from a first reference surface position to a second reference surface position.

The foregoing and other objects, features, and advantages will be apparent from the following, more particular, description of the preferred embodiments of the invention, as illustrated in the accompanying drawings.

THE SPECIFICATION

Referring to FIG. 1, an object transport apparatus for conveying an object from a first reference surface position to a second reference surface position is shown generally at reference number 10. The transport apparatus 10 is shown provided with a pickup means, shown generally by reference number 20, for releasably engaging the object. Referring additionally to FIG. 2, a sectional view taken along line 2—2 of FIG. 1, and to FIG. 3, a sectional view taken along line 3—3 of FIG. 1, it will be seen that the pickup means 20 are provided with an elongated arm member 22 having opposed first and second ends, a pickup surface 25 located near the first end of the arm 22, which pickup surface 25 is provided with at least a vacuum orifice 24 defined by the pickup surface 25. To provide optimal dynamic response, the arm 22 is preferably fabricated from high strength low mass material, such as aluminum or magnesium. The vacuum orifice 24 is coupled to a selectively operable vacuum source by an arm vacuum passage 28 open to the vacuum orifice 24, a flexible vacuum hose 30 open to the arm vacuum passage 28 and also open to a shaft vacuum passage 48 which terminates in a vacuum inlet 50. The vacuum inlet 50 is, in turn, connected to an external vacuum source.

Referring also to FIG. 4, it can be seen that the arm 22 is supported at a central portion between the ends by pivot means for engaging the arm 22, as for example, a pair of pivots 42. The pickup means 20 are further provided with a cam follower 32 having a cam follower surface, preferably threadedly mounted in a dielectric cam follower bushing 33 coupled to the arm body 22. The pickup means 20 are preferably provided with a plurality of grip fingers 26 which are in communication with, and define the periphery of, the pickup surface 25 so that an object adhered to the pickup surface 25 is restrained from lateral movement, as for example, during the scrubbing of a semiconductor chip onto a lead frame to form a eutectic bond. It can be seen that the pickup surface 25, pivotally mounted about the pivots 42, has a finite range of elevations having an upper limit and a lower limit.

Alternatively, the arm 22 can be provided with a socket (not shown) adapted to receive the shank of a conventional die collet (not shown), thereby allowing various die collet configurations to be used in lieu of the combination of the pickup surface 25 and the grip fingers 26. It is apparent that the pickup surface 25 can be indexed to a position parallel, in a first plane perpendicular to the axis formed by the pivots 42, to a reference surface by traversing the cam follower 32 threadedly mounted in the dielectric cam follower bushing 33. The arm 22 can be fabricated in two parts, as indicated by the break shown in FIGS. 1, 2 and 3. It is also apparent that the pickup surface 25 can be indexed to a position parallel, in a second plane parallel to the axis formed by the pivots 42 and perpendicular to the longitudinal axis of the arm 22, to a reference surface by fabricating the arm 22 in two pieces and releasably mechanically coupling the two pieces so that the plane of the pickup surface 25 can be rotated about the longitudinal axis of the arm 22.

The transport apparatus 10 is further comprised of transport means cooperatively connected to the pickup means 20 for selecting any desired path of travel from the first reference surface position, through an arcuate motion having an independently variable range of elevations equal to the vertical limits of the pickup means 20, to the second reference surface position. The transport means is provided with a frame shown generally by reference number 70, having a frame body 72 for supporting the other operative elements of the transport apparatus, and rotation means, shown generally by reference number 40, for rotating the pivot means, coupled to the rotation means 40 and the arm 22, in a reversible angular motion over an arcuate range. The rotation means 40 are comprised of, as for example, a shaft 52 having an axis rotatably mounted to the frame 70; a shaft yoke 44 engaging the pivots 42 on a pivotal axis orthogonally disposed to the shaft axis in a plane parallel to the shaft axis; a driven sprocket 54 coupled to the shaft 52; a cogged belt 56 engaging the driven sprocket 54; a driver sprocket 58 engaging the cogged belt 56 at a point remote from the driven sprocket 54; and a rotation motor 62 supported by the frame 70 and having a rotation motor shaft 60 coupled to the driver sprocket 58. The rotation motor 62 is preferably an electrical stepping-type motor which, being provided with a defined reference position, can be rotated in incremental steps by application of timed current pulses, thereby providing an index of motion from the reference position. The shaft yoke 44 is coupled to the flexible vacuum hose 30, and partially defines the shaft vacuum passage 48 which is further defined by the shaft 52. The vacuum inlet 50 is preferably integral with the shaft 52 and aligned on the shaft axis. Referring additionally to FIG. 4, a sectional view taken along line 4—4 of FIG. 2, and to FIG. 5, a sectional view taken along line 5—5 of FIG. 2, it will be seen that the transport means are further comprised of a cam means, shown generally by reference number 80, for pivoting the arm 22 in a reversible pivotal motion about the pivot means over a pivotal motion range.

The cam means 80 are supported by the frame 70 and comprised of a cam motor 82 mounted to the frame body 72, having a cam motor shaft 86 having a cam motor shaft axis; a cam mandrel 88 coupled to the cam motor shaft 86; a cam roller 90 having an axis of rotation and a cam surface for contacting the cam follower surface coupled to the cam mandrel 88 so that the axis of rotation is parallel to but not coincidental with the cam motor shaft axis. The cam motor 82 is preferably an electrical stepping-type motor which, being provided with a defined reference position, can be rotated in incremental steps by application of timed current pulses, thereby providing an index of motion from the reference position. The cam follower surface is preferably positioned in a symmetric manner about the shaft axis, so that, at any point within the rotation means 40 produced range of arcuate motion, the cam motor 82 may be driven to revolve the eccentrically mounted cam roller 90 about the cam motor shaft 86, contacting the cam follower surface with the cam surface and thereby pivoting the arm body 22 and the pickup surface 25 about the pivots 42. The pickup means 20 are also preferably provided with a spring 34 coupled, as for example, to the arm body 22 at an arm spring anchor 36 and coupled to the yoke 44 at a yoke spring anchor 46, for loading the cam follower surface of the cam follower 32 toward the cam surface of the cam roller 90.

The transport means are further comprised of: control means having an input receiving means for receiving at least one input and output sending means for sending at least one output for controllably operating the transport apparatus 10; rotation data means for defining a position of the arm 22 within the arcuate motion range as a first of the inputs; cam position data means for defining a position of the arm 22 within the pivotal motion range as a second of the inputs; contact indicator means for defining a contact of any of the grip fingers 26 with one of the reference surface positions as a third of the inputs; and reference surface position data input means for defining the first reference surface position as a fourth of said inputs and the second reference surface postion as a fifth of the inputs. The control means are preferably comprised of a microprocessor 110 electrically coupled to the transport apparatus 10, capable of receiving and storing a plurality of instructions, receiving the plurality of data inputs, processing the data inputs according to the programmed instructions, and sending at least one control signal based on the conclusion of that processing operation.

Referring to FIG. 1, the rotation data means are shown comprised of a rotation index plate 64 concentrically mounted about the rotation motor shaft 60, a rotation index plate slot 65 in the rotation index plate 64, and a rotation index sensor means 66 for detecting the presence of the rotation index plate slot 65 at a given reference position. The rotation index sensor means 66 are comprised, as for example, of an electric optical sensor so arranged as to send a signal to the control means when the rotation index plate slot 65 is engaged by the electric optical sensor.

Referring to FIGS. 1 and 4, the cam position data means are shown comprised of a cam index plate 94 concentrically mounted about the cam motor shaft 86, a cam index plate slot 96 in the cam index plate 94, and cam index sensor means 98 for detecting the presence of the cam index plate slot 96 at a given reference position. The cam index sensor means 98 are comprised, as for example, of an electric optical sensor so arranged as to send an electrical signal to the control means when the cam index plate slot 96 is engaged by the electric optical sensor.

With the cam index sensor means 98 providing an initial index position for the cam mandrel 88, and necessarily also for the cam roller 90, the cam motor 82 being an electrical stepping-type motor, and control being provided by a programmable electronic computer, it can be seen that the degree of rotation of the cam roller 90 can be independently and precisely controlled, thereby operating in conjunction with the spring 34 to move the cam follower surface and provide the pickup surface 25 with a pivotal motion about the pivots 42 in the finite range of elevations having the upper limit and the lower limit.

The contact indicator means are comprised of, as for example, the cam roller 90 having an electrically conductive cam surface electrically connected to the control means and the cam follower 32 provided with an electrically conductive cam follower surface electrically connected to the control means. Referring to FIG. 2, it can be seen that the pickup surface 25 and the surrounding grip fingers 26 are lowered by driving the cam motor 82 in a direction tending to move the cam roller 90 away from the cam follower 32. Contact is normally maintained between the cam follower 32 and the cam roller 90 by the spring 34. When the grip fingers 26 make contact with a surface, as for example, one of the reference surfaces, and the cam motor 82 is further driven in a direction tending to move the cam roller 90 away from the cam follower 32, the arm body 22 is restrained from further motion by the contact of the grip fingers 26 with the surface resulting in a break in the physical and the electrical contact between the cam follower surface of cam follower 32 and the cam surface of the cam roller 90. This break in electrical conductivity can be defined by the control means with reference to the exact position of the cam motor 82, thereby providing an exact definition of the elevation of the grip fingers 26 when contact is made with the surface. Furthermore, the control means can be programmed to stop rotation of the cam motor 82 prior to the grip fingers 26 contacting the surface so that the pickup surface 25 may be positioned immediately above the pickup surface while avoiding contact of the grip fingers 26 with the pickup surface. The control means could be further programmed to independently define the elevation of the two respective reference surfaces, and further programmed to control the exact elevation of the grip fingers 26 above the reference surface at the time of pickup with respect to the thickness of the object being transported.

The reference surface position data input means for defining the first reference surface position and the second reference surface position as control means inputs are preferably comprised of at least one electro-optical sensor capable of scanning a surface and providing an electronic output defining an image of that surface and constituting a control means input. The control means then compares that input image with a programmed virtual image and processes differences in the images to direct the actual reference surface position as defined with respect to the corresponding virtual reference surface position.

In operation, the transport apparatus 10 is advantageously used in a semiconductor production process, for example, when separating individual semiconductor chips from a semiconductor wafer and attaching those individual semiconductor chips to individual lead frames. Preferably, the lead frames are sequentially mounted in a position shifting apparatus such that only one second reference surface position need be defined. The individual semiconductor chips lie in a matrix pattern forming the wafer, thus requiring that either each of the semiconductor chips be sequentially shifted to the first reference surface position or that the transport apparatus be shifted to allow the first reference surface position to sequentially coincide with the position of each of the individual semiconductor chips in the wafer matrix. In practice, it has been found preferable to mount the transport apparatus on a first X-Y transport mechanism controlled by the control means to provide any lateral motion necessary to allow the pickup surface 25 to swing to its travel limits and still meet the first and second reference surface positions, and to also mount the wafer supporting first reference surface on a second control means controlled X-Y transport mechanism which can shift the individual semiconductor chips in the wafer matrix to a single first reference surface position.

The transport apparatus 10, starting from an initial index position, starts operation by swinging the pickup surface 25 of the arm 22 about the axis of the shaft 52 by driving the rotation motor 62, the driver sprocket 58, the cogged belt 56, and the driven sprocket 54 coupled to the shaft 52. Although the rotation means 40 are provided with a pair of yoke stops 45 mounted on the yoke 44 and the frame 70 is provided with a pair of frame stops 76 mounted to the frame body in alignment with the yoke stops 45 so that the limits of the arcuate range of motion are defined, the angular motion can be stopped at any selected point within the arcuate range. Simultaneously, with the step of rotating the arm 22, the cam motor 82 may be driven to pivot the arm 22 and the pickup surface 25 about the pivots 22 so that the pickup surface 25 is immediately above the object to be picked at such time that the pickup surface 25 reaches the first reference surface position. The external vacuum source then applies vacuum, at the command of the control means, to the vacuum inlet 50, the shaft vacuum passage 48, the flexible vacuum tube 30, the arm vacuum passage 28, and to the vacuum orifice 24, thereby adhering the object to the pickup surface 25. The cam motor 82 is then driven in an opposite direction thereby pivoting the pickup surface 25 in an upward direction about the pivots 42 a distance adequate to avoid interference with any adjacent object or obstruction, whereupon the rotation motor 62 is also driven in an opposite direction thereby rotating the arm 22 and pickup surface 25 about the shaft axis in an arcuate motion toward the second reference surface position. While the acceleration of the pickup surface 25 about the pivots 42 could be controlled by a contoured surface on the cam roller 90, in the preferred embodiment the angular acceleration rates of the pickup surface 25 about the pivots 42 and about the axis of the shaft 52 are both determined by the timed electrical pulses respectively applied to the cam motor 82 and the rotation motor 62 by the microprocessor 110. The control means continues to drive the cam motor 82 until every portion of the pickup means 20 can clear any intervening obstruction, whereupon the rotation of the cam motor is reversed thereby pivoting the pickup surface 25 downward so that it is immediately above the second reference surface position when the rotation motor 62 completes the step of rotating the pickup surface to the second reference surface position. The external vacuum source then releases the vacuum at the command of the control means thereby releasing the object at the second reference surface position. Alternately, prior to releasing the object, the cam motor 82 may be driven an additional incremental amount to allow the object to come into physical contact with the second reference surface position and the X-Y transport mechanism may then be reciprocated to "scrub" the object into the second reference surface position, as for example, to form a eutectic bond between a semiconductor chip and a lead frame. Subsequent to the release of the object, the cam motor 82 and the rotation motor 62 may be simultaneously driven to either return the transport apparatus to the index position or to continue the transport process as a cylical operation.

The above description of preferred embodiments is given by way of example only. Changes in form and details may be made by one skilled in the art without departing from the scope of the invention as defined by the appended claims.

I claim:

1. An object transport apparatus for conveying at least one object from a first reference surface position to a second reference surface position, comprising:
    pickup means having a pickup surface for releasably engaging said object;
    said pickup means including an elongated arm member;
    said pickup surface defining at least a vacuum orifice;
    said pickup means further having a selectively operable vacuum source open to said vacuum orifice;
    transport means cooperatively connected to said pickup means for swinging said pickup surface from said first reference position through an arcuate path having an independently selectively variable range of elevations to said second reference position;
    said transport means having a frame;
    said transport means further having a shaft rotatably supported about an axis by said frame for rotating said arm in a reversible angular motion over an arcuate range;
    said transport means including pivot means for pivotally engaging said arm to said shaft;
    said transport means yet further comprising cam means supported by said frame for pivoting said arm in a reversible pivotal motion about said pivot means over a pivotal range;
    said arm having a cam follower surface for contacting at least a portion of said cam means; and
    said cam follower surface having symmetry about said shaft axis so that said cam means can independently deflect said pickup surface to any elevation position of said arm within said arcuate range.

2. An object transport apparatus in accordance with claim 1 wherein said cam means comprises:
    a cam roller having an axis of rotation and a cam surface for contacting said cam follower surface;
    a spring cooperatively coupled to said arm body and to said yoke for loading said cam follower surface toward said cam roller;
    a cam mandrel coupled to said cam roller; and
    a cam motor mounted to said frame, having a cam motor shaft provided with a cam motor shaft axis parallel to but not coincidental with said axis of rotation coupled to said cam mandrel.

3. An object transport apparatus in accordance with claim 2 wherein said cam motor is an electrical stepping-type motor.

4. An object transport apparatus in accordance with claim 3 wherein said pickup means further comprises a plurality of grip fingers in communication with said pickup surface so that a lateral motion of said object on said pickup surface is prevented.

5. An object transport apparatus in accordance with claim 4 wherein said transport means further comprises:
    control means having input receiving means for receiving at least one input and output sending means for sending at least one output for controllably operating said transport apparatus;
    rotation data means for defining a position of said arm in said arcuate range as a first of said inputs;
    cam position data means for defining a position of said arm in said pivotal range as a second of said inputs; and
    contact indicator means for defining a contact of any of said grip fingers with one of said reference surface positions as a third of said inputs.

6. A transport apparatus in accordance with claim 5 wherein said rotation data means comprises a rotation index plate concentrically mounted on said rotation motor shaft, a rotation index plate slot in said rotation index plate, and a rotation index sensor means for detecting the presence of said rotation index plate slot at a given reference position.

7. A transport apparatus in accordance with claim 6 wherein said cam position data means comprises a cam index plate concentrically mounted about said cam motor shaft, a cam index plate slot in said cam index plate, and cam index sensor means for detecting the presence of said cam index plate slot at a given reference position.

8. A transport apparatus in accordance with claim 7 wherein said contact indicator means comprises:
- a dielectric cam follower bushing coupled to said arm body and engaging said cam follower;
- said cam follower and said cam roller having electrical conductivity; and
- electrical connections between said cam follower and said control means between said cam roller and said control means.

9. An object transport apparatus for conveying at least one object from a first reference surface position to a second reference surface position, comprising:
- pickup means having an upper and a lower vertical travel limit for releasably engaging said object;
- transport means cooperatively connected to said pickup means for selecting any desired path of travel from said first reference position through an arcuate motion having an independently variable range of elevations equal to said vertical travel limits of said pickup means to said second reference position.
- said pickup means including an elongated arm member having opposed first and second ends;
- said pickup means further including a pickup surface located near said first end of said arm having at least a vacuum orifice defined by said pickup surface coupled to a selectively operable vacuum source;
- said transport means comprising a frame;
- said transport means further comprising rotation means supported by said frame, having pivot means for engaging said arm between said ends, for rotating said pivot means and said arm in a reversible angular motion over an arcuate range;
- said transport means yet further comprising cam means supported by said frame for pivoting said arm in a reversible pivotal motion about said plurality of pivots over a pivotal range;
- said arm has a cam follower surface for contacting at least a portion of said cam means;
- said pivot means comprising a pair of pivots;
- said rotation means comprising a shaft yoke engaging said pivots;
- said rotation means further comprising a shaft having an axis rotatably mounted to said frame and coupled to said shaft yoke;
- said rotation means having a driven sprocket coupled to said shaft;
- said rotation means including a cogged belt engaging said driven sprocket;
- said rotation means provided with a driver sprocket engaging said cogged belt at a point remote from said driven sprocket;
- said rotation means further comprising a rotation motor having a rotation motor shaft coupled to said driver sprocket and supported by said frame;
- said rotation motor comprising a stepping-type electrical motor;
- said pickup means further comprising said arm having an arm vacuum passage open to said vacuum orifice, and a flexible vacuum hose open to said arm vacuum passage and coupled to said arm and to said yoke;
- said pickup means including said shaft yoke and said shaft having a common shaft vacuum passage open to said flexible vacuum hose and coupled to said selectively operable vacuum source; and
- said cam follower surface has symmetry about said shaft axis.

10. A method for transporting an object, comprising the steps of:
- swinging said object from a first reference surface position to a second reference surface position;
- said step of swinging comprising the step of engaging said object at said first reference surface position with a pickup surface;
- said step of swinging further comprising the step of pivoting said pickup surface in an upward direction about a pivot axis;
- said step of swinging including the step of rotating said pickup surface about a shaft axis in an arcuate motion toward said second reference surface position;
- said step of swinging further including the step of pivoting said pickup surface in a downward direction so that said pickup surface is positioned immediately adjacent to said second reference surface position; and
- said step of swinging yet further comprising the step of releasing said object;
- said step of pivoting comprising the step of supporting said pickup surface with an arm;
- said step of pivoting further comprising the step of mounting a cam follower surface on said arm opposed to said pickup surface with respect to said pivot axis;
- said step of pivoting including the step of loading said cam follower surface toward said cam;
- said step of pivoting further including the step of driving said cam to move said cam follower surface;
- said step of rotating further comprising the step of supporting said arm about said pivot axis with a shaft assembly having an axis of rotation orthogonally disposed with respect to said pivot axis in a plane parallel to said pivot axis;
- said step of rotating including the step of positioning said axis of rotation symmetrically about and generally perpendicular to said cam follower surface; and
- said step of rotating further including the step of revolving said shaft.

* * * * *